United States Patent
Chen et al.

(10) Patent No.: US 11,695,410 B2
(45) Date of Patent: Jul. 4, 2023

(54) VOLTAGE ISOLATION CIRCUIT

(71) Applicants: Yung-Lin Chen, Taoyuan (TW);
Szu-Chieh Su, Taoyuan (TW);
Lien-Sheng Hung, Taoyuan (TW);
Chun-Tai Cheng, Taoyuan (TW);
Hsi-Ping Tsai, Taoyuan (TW);
Szu-Hsin Yeh, Taoyuan (TW)

(72) Inventors: Yung-Lin Chen, Taoyuan (TW);
Szu-Chieh Su, Taoyuan (TW);
Lien-Sheng Hung, Taoyuan (TW);
Chun-Tai Cheng, Taoyuan (TW);
Hsi-Ping Tsai, Taoyuan (TW);
Szu-Hsin Yeh, Taoyuan (TW)

(73) Assignee: Chroma ATE Inc., Taoyuan (TW)

( * ) Notice: Subject to any disclaimer, the term of this patent is extended or adjusted under 35 U.S.C. 154(b) by 0 days.

(21) Appl. No.: 17/478,925

(22) Filed: Sep. 19, 2021

(65) Prior Publication Data
US 2022/0094354 A1    Mar. 24, 2022

(30) Foreign Application Priority Data
Sep. 21, 2020   (TW) ................................ 109132493

(51) Int. Cl.
*H03K 17/56*   (2006.01)
(52) U.S. Cl.
CPC .................................... *H03K 17/56* (2013.01)

(58) Field of Classification Search
CPC ...... H03K 17/56; H02J 7/0047; H02J 7/0024; G01R 1/206; G01R 19/0084; G06F 1/263
See application file for complete search history.

(56) References Cited

U.S. PATENT DOCUMENTS

| 8,310,177 | B2 * | 11/2012 | Naumann | B25F 5/00 318/504 |
| 2013/0035819 | A1 * | 2/2013 | Wolft | B60L 3/0046 701/22 |

\* cited by examiner

*Primary Examiner* — John W Poos
*Assistant Examiner* — Tyler J Pereny

(57) ABSTRACT

Herein disclosed is a voltage isolation circuit coupled to power supplies. The voltage isolation circuit comprises a series switch group controlled by a first control signal, a parallel switch group controlled by a second control signal, and a first high impedance element. The series switch group comprises a transistor arranged in a first current loop and having two channels connected to one of the power supplies respectively. The first high impedance element, coupled to the transistor in parallel, has a measurement terminal and two ends, connected to one of the power supplies respectively. When the series switch group is conducted, the power supplies are coupled in series in the first current loop. When the parallel switch group is conducted, the power supplies are coupled in parallel in a second current loop. Impedance values measured from the measurement terminal to each end of the first high impedance element are identical.

5 Claims, 4 Drawing Sheets

VOLTAGE ISOLATION CIRCUIT

CROSS REFERENCE TO RELATED APPLICATION

The present application claims priority to Taiwan patent application Serial No. 109132493 filed on Sep. 21, 2020, the entire content of which is incorporated by reference to this application.

BACKGROUND OF THE INVENTION

1. Field of the Invention

The present invention pertains to a voltage isolation circuit, more specifically to a voltage isolation circuit electrically connected between a power supply and a load device.

2. Description of the Prior Art

Traditionally, in order to test a manufactured load device (such as a battery), a power supply is often used to provide voltage and current to measure the electrical parameters of the charging load device. The power supply with multifunction can not only provide the voltage and current to the load device, but also can receive the voltage and current transmitted from the load device to measure the electrical parameters of the discharging load device. However, with the rapid development of power storage technologies, the rated power of load device is getting higher and higher. A single power supply may not be able to provide sufficient charging voltage and current to the load device, and the voltage and current output by the load device also may not be able to be measured by a single power supply.

In order to cope with the above-mentioned problems, multiple power supplies are often connected in series while measuring a load device. Please refer to FIG. 1, FIG. 1 is a schematic diagram of the traditional power supply and the traditional load device. As shown in FIG. 1, the power supply 91, the power supply 92, and the power supply 93 are, for example, identical models. In order to provide a larger voltage to the load device DUT, the power supply 91, the power supply 92, and the power supply 93 are electrically connected in series. Besides, in order to isolate the load device DUT and the power supply 91-93, a switch unit 94 is usually provided between the load device DUT and the power supply 93. In practice, although a large enough voltage can be provided by the power supply 91-93 connected in series, but it will be inconvenient or failed while reading the voltage value when the power supply 91, the power supply 92, and the power supply 93 are used to measure the voltage of the load device DUT. For example, suppose that the voltage across the load device DUT is 1000 volts. Taking FIG. 1 as an example, since the impedance at both ends of the switch unit 94 is much larger than the internal impedance of the power supply 91, the power supply 92, and the power supply 93, almost all 1000 volts will be applied to the both ends of the switch unit 94. Obviously, the power supply 91, the power supply 92, and the power supply 93 cannot read the correct voltage value when the voltages shown at the power supply 91, the power supply 92, and the power supply 93 are extremely small.

In addition, if the power supply 91, the power supply 92, and the power supply 93 are all connected in series, person having ordinary skilled in the art should understand that the circuit shown in FIG. 1 can only provide high voltage to the load device DUT. If the load device DUT needs to be tested with high current, the circuit shown in FIG. 1 can no longer be used, which might lower the test efficiency. Accordingly, a new voltage isolation circuit is needed which should be able to provide high voltage and high current selectively, and also be able to read the cross voltage of the load device DUT correctly.

SUMMARY OF THE INVENTION

The present invention provides a voltage isolation circuit, which is arranged between a power supply and a load device. When the power supply is to supply power to the load device, the voltage isolation circuit of the present invention can switch to provide high voltage and high current, and when the power supply is to measure the load device, the voltage isolation circuit of the present invention can also enable the power supply Correctly reads the cross voltage of the load device The present invention discloses a voltage isolation circuit electrically connected between a first power supply and a second power supply. The voltage isolation circuit comprises a first transistor, a second transistor, a third transistor, and a first high impedance element. The first transistor is electrically connected to a negative terminal of the first power supply and a positive terminal of the second power supply. The second transistor is electrically connected to a positive terminal of the first power supply and a positive terminal of the second power supply. The third transistor is electrically connected to the negative terminal of the first power supply and the negative terminal of the second power supply. The first high impedance element, electrically connected to the first transistor in parallel, has a measurement terminal. Wherein impedance values measured from the negative terminal of the first power supply to the measurement terminal and measured from the measurement terminal to the positive terminal of the second power supply are the same. Wherein the first transistor is controlled by a first control signal, when the first transistor is conducted, the first power supply and the second power supply are electrically connected in series in a first current loop. Wherein the second transistor and the third transistor are controlled by a second control signal, when the second transistor and the third transistor are conducted, the first power supply and the second power supply are electrically connected in parallel in a second current loop.

In some embodiments, the voltage isolation circuit might have a first end, a second end, and a switch unit. The positive terminal of the first power supply might be connected to the first end. The negative terminal of the second power supply might be connected to the second end. The first end and the second end might be electrically connected to a load device. The switch unit might selectively conduct the first end and the second end to first power supply and the second power supply. Besides, the voltage isolation circuit might have a reverse connection detection loop. When the first power supply and the second power supply are operated in a measurement mode, the reverse connection detection loop might determine whether the load device is reversely connected. When the load device is reversely connected, the switch unit might not conduct the first end and the second end to the first power supply and the second power supply. In addition, the voltage isolation circuit might have a short-circuit detection loop. When the first power supply and the second power supply are operated in a power supply mode, the short-circuit detection loop might determine whether the first end and the second end are shorted. When the first end and the second end are shorted, the switch unit might not conduct the first end and the second end to the first power supply and the second power supply.

In some embodiments, the first power supply and the second power supply stop supplying power after the switch unit does not conduct the first end and the second end to the first power supply and the second power supply. The first power supply and the second power supply might provide power in a constant current mode after output voltages of the first power supply and the second power supply are zero respectively.

The present invention also discloses a voltage isolation circuit which is electrically connected to a plurality of power supplies. The voltage isolation circuit comprises a series switch group, a parallel switch group, and a first high impedance element. The series switch group is controlled by a first control signal and comprises a transistor, arranged in a first current loop, having two channels, connected to one of the plurality of power supplies respectively. The parallel switch group is controlled by a second control signal. The first high impedance element, electrically connected with the transistor in parallel, has a measurement terminal and two ends, connected to one of the plurality of power supplies respectively. Wherein when the series switch group is conducted, the plurality of power supplies are electrically connected in series in the first current loop. Wherein when the parallel switch group is conducted, the plurality of power supplies are electrically connected in parallel in a second current loop. Wherein impedance values measured from the measurement terminal to each ends of the first high impedance element are the same.

In some embodiments, the voltage isolation circuit might comprise a first end and a second end. The first end is connected to one of the power supplies, the second end is connected to the other power supply, and the first and second ends are electrically connected to a load device to obtain an external voltage value of the load device. Wherein when a total voltage value, provided by the plurality of power supplies, is the same as the external voltage value, a processing unit might provide the first control signal that the plurality of power supplies are electrically connected in series in the first current loop. Wherein when a specific voltage value, provided by each of the plurality of power supplies, is the same as the external voltage value, a processing unit might provide the second control signal that the plurality of power supplies are electrically connected in parallel in the second current loop.

Based on the above, the voltage isolation circuit provided by the present invention can provide high voltage and high current selectively while providing power to the load device. And, the cross voltage of the load device can be read by the power supplies correctly when the load device is to be measured. In addition, the voltage isolation circuit provided by the present invention can also detect the voltage difference between the power supply and the load device, so as to prevent the power supply and the load device from being conducted when the voltage difference is too large, and reduce the possibility of danger.

BRIEF DESCRIPTION OF THE APPENDED DRAWINGS

DETAILED DESCRIPTION OF THE INVENTION

The features, objections, and functions of the present invention are further disclosed below. However, it is only a few of the possible embodiments of the present invention, and the scope of the present invention is not limited thereto; that is, the equivalent changes and modifications done in accordance with the claims of the present invention will remain the subject of the present invention. Without departing from the spirit and scope of the invention, it should be considered as further enablement of the invention.

Figure 2:
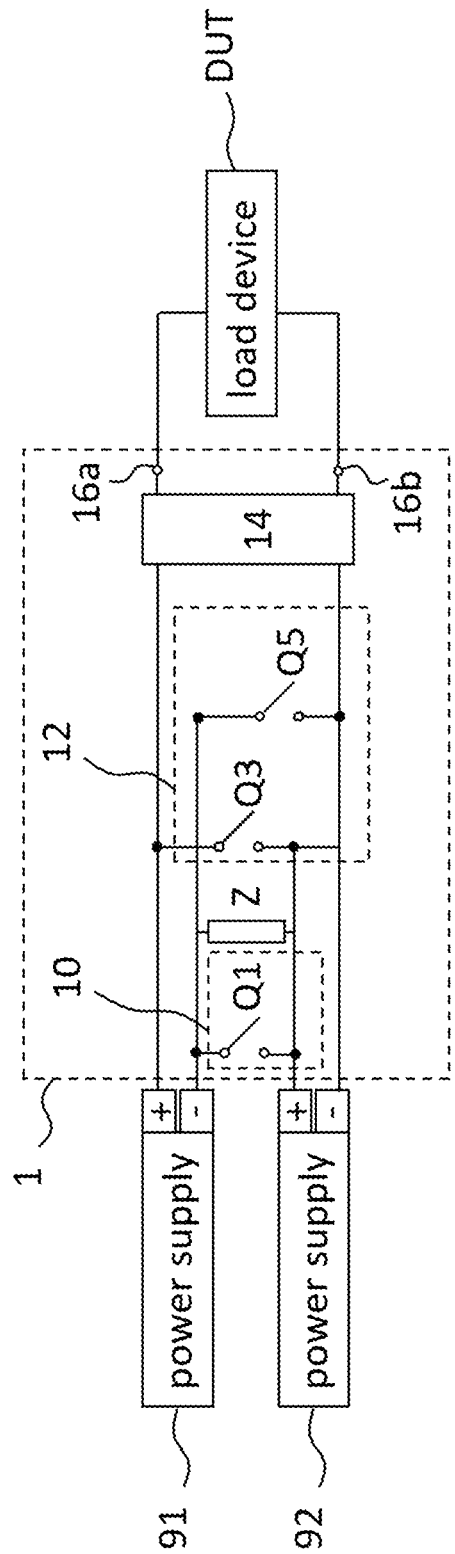
FIG. 2 is a schematic diagram of the voltage isolation circuit in accordance with an embodiment of the present invention.

Please refer to FIG. 2. FIG. 2 is a schematic circuit diagram of a voltage isolation circuit according to an embodiment of the present invention. As shown in FIG. 2, the voltage isolation circuit 1 is disposed between the power supply 91 (the first power supply), the power supply 92 (the second power supply) and the load device DUT. The voltage isolation circuit 1 comprises a series switch group 10, a parallel switch group 12, and a switch unit 14. The first end 16a is connected to the positive terminal of the load device DUT, and the second end 16b is connected to the negative terminal of the load device DUT. In practice, the load device DUT can be a large capacitor or a high-capacity battery, and the type of the capacitor or battery should not be limited in this embodiment. In addition, the power supply 91 and the power supply 92 may have a power supply mode and a measurement mode. The power supply mode means that the power supply 91 and the power supply 92 can provide voltage and current to the load device DUT, and the measurement mode means that the power supply 91 and the power supply 92 can receive and measure the voltage and current from the load device DUT. Although FIG. 2 uses two power supplies as an example, this embodiment does not limit the number of power supplies. The components in the voltage isolation circuit 1 will be described below.

The series switch group 10 may have a transistor Q1 (the first transistor), and the parallel switch group 12 may have a transistor Q3 (the second transistor) and a transistor Q5 (the third transistor). Since the transistor Q1, the transistor Q3, and the transistor Q5 are used as switches, each of the transistor Q1, the transistor Q3, and the transistor Q5 shown in FIG. 2 can be considered as two ends elements. However, person having ordinary skilled in the art should understand that the two ends can be channels, and each of the transistor Q1, the transistor Q3, and the transistor Q5 can further have a control terminal (not shown in figures) for receiving corresponding control signals. In an example, if the transistor Q1 is a MOSFET, the two channels of the transistor Q1 are the source and the drain. The control terminal of the transistor Q1 may be a gate to receive the first control signal, and the transistor Q1 is conducted or off according to the first control signal. Person having ordinary skilled in the art should understand that the characteristics of the transistor Q3 and the transistor Q5 can be the same as the characteristics of transistor Q1, and the control terminals of the transistor Q3 and the transistor Q5 can be controlled by the second control signal and the third control signal respectively. Therefore, the transistor Q3 and the transistor Q5 can be conducted or off according to the second control signal and the third control signal.

The switch unit 14 may be provided between the power supply 91, the power supply 92, and the load device DUT. For example, the switch unit 14 may be one or more relays. This embodiment does not limit the layout of the switch unit 14. As long as the power supply 91 and the power supply 92 can selectively electrically connect to the load device DUT through the switch unit 14, it should meet the definition the switch unit 14 of this embodiment. In one example, the switch unit 14 can be connected to the positive terminal of the power supply 91 and the negative terminal of the power supply 92. The switch unit 14 can selectively conduct the positive terminal of the power supply 91 to the first end 16a, and/or conduct the negative terminal of the power supply 92 to the second end 16b. It is worth mentioning that the switch unit 14 is not a necessary component of the voltage isolation circuit 1, that is, the voltage isolation circuit 1 of this embodiment does not necessarily need the switch unit 14, but should also be able to realize basic functions of conducting multiple power supplies in series or in parallel.

Taking the circuit of FIG. 2 as an example, the two channels of the transistor Q1 can be connected to the negative terminal of the power supply 91 and the positive terminal of the power supply 92 respectively. When the series switch group 10 is conducted (that is, the transistor Q1 is conducted), the power supply 91 can be connected in series with the power supply 92. In addition, the two channels of the transistor Q3 can be respectively connected to the positive terminal of the power supply 91 and the positive terminal of the power supply 92, and the two channels of the transistor Q5 can be respectively connected to the negative terminal of the power supply 91 and the negative terminal of the power supply 92. When the parallel switch group 12 is conducted (that is, the transistor Q3 and the transistor Q5 are conducted at the same time), the power supply 91 can connect the power supply 92 in parallel.

In practice, the user can select the operation mode of the power supply 91 and the power supply 92 according to the items for the load device DUT to be tested, and select whether the power supply 91 and the power supply 92 are connected in series or in parallel. In an example, assuming that the user needs to test the load device DUT with a large voltage, the user can set the power supply 91 and the power supply 92 to operate in the power supply mode. Then, the user can control the voltage isolation circuit 1 by a processing unit (such as a computer), so that the series switch group 10 is conducted and the parallel switch group 12 is not conducted. In detail, the processing unit can send a first control signal to turn on the transistor Q1 (at this time, the transistor Q3 and the transistor Q5 are not conducted), so that the power supply 91 and the power supply 92 can form a series current loop (the first current loop). Person having ordinary skilled in the art should understand that since the power supply 91 and the power supply 92 operate in the power supply mode, the voltage across the positive terminal of the power supply 91 and the negative terminal of the power supply 92 is large when the power supply 91 is connected in series with the power supply 92. For the convenience of description, the switch unit 14 can be set to ON state, so that the cross voltage between the first end 16a and the second end 16b is the sum of the output voltages of the power supply 91 and the power supply 92, so a larger voltage can be used to test the load device DUT.

On the other hand, assuming that the user needs to test the load device DUT with a large current, the user can also set the power supply 91 and the power supply 92 to operate in the power supply mode. In addition, the user can control the voltage isolation circuit 1 by a processing unit (such as a computer), so that the parallel switch group 12 is conducted and the series switch group 10 is not conducted. In other words, the processing unit can send the second control signal and the third control signal so that the transistor Q3 and the transistor Q5 are conducted at the same time (the transistor Q1 is not conducted at this time). Therefore, the power supply 91 and the power supply 92 can be connected in a parallel current loop (the second current loop). Person having ordinary skilled in the art should understand that since the power supply 91 and the power supply 92 operate in the power supply mode, the power supply 91 and the power supply 92 can provide a accumulated current when the power supply 91 is connected in parallel with the power supply 92. Similarly, assuming that the switch unit 14 is conducted, the accumulated output current of the power supply 91 and the power supply 92 can be fed into the load device DUT from the first end 16a.

Figure 1:
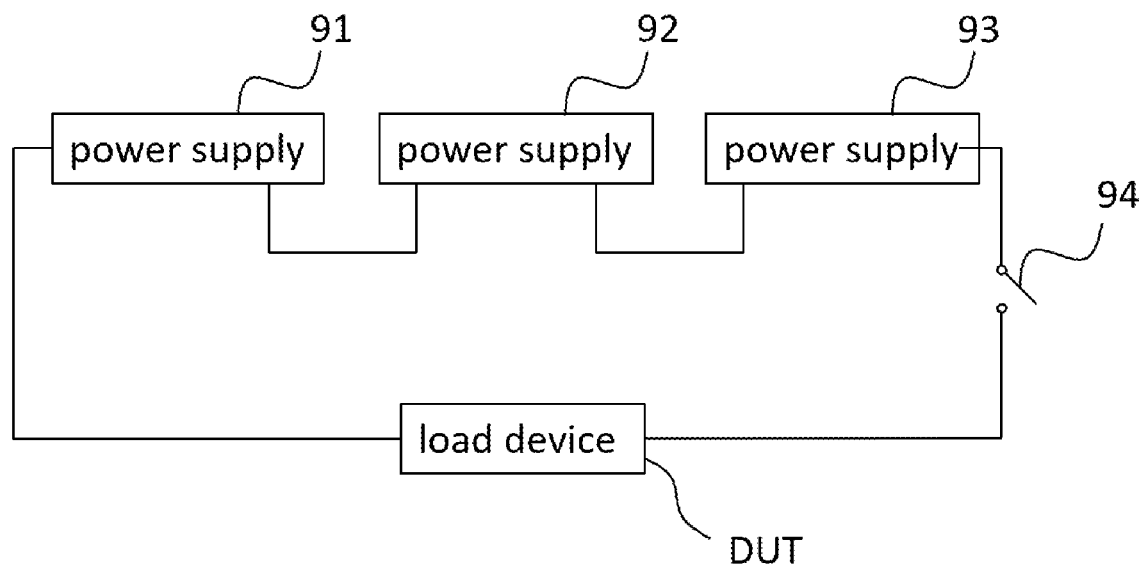
FIG. 1 is a schematic diagram of the traditional power supply and the traditional load device.

It can be seen from the above that the voltage isolation circuit 1 of this embodiment allows the power supply 91 and the power supply 92 to switch between series and parallel connections at will. Different from the traditional example shown in FIG. 1, the voltage isolation circuit 1 provided in this embodiment does not require to reassemble the wire connecting the power supply 91 and the power supply 92, and has the function of outputting a large voltage or a large current to test the load device DUT. Of course, in the above example, the power supply 91 and the power supply 92 are operated in the power supply mode, and the power supply 91 and the power supply 92 can also be operated in the measurement mode to measure the voltage across the load device DUT (an external voltage value). It can be seen from FIG. 2 that the voltage isolation circuit 1 further comprises a high impedance element Z (the first high impedance element), and the high impedance element Z is electrically connected to the transistor Q1 in parallel. In practice, since the high impedance element Z has a very high impedance, the current flowing through the high impedance element Z can be roughly ignored. In addition, the high impedance element Z has a measurement terminal (not shown), and the impedance values from the measurement terminal to each ends of the high impedance element Z are the same. In one example, the power supply 91 may have a probe electrically connected to the measurement terminal of the high impedance element Z, and may have another probe electrically connected to the positive terminal of itself (the power supply 91). Similarly, the power supply 92 may have a probe electrically connected to the measurement terminal of the high impedance element Z, and may have another probe electrically connected to the negative terminal of itself (the power supply 92).

Taking FIG. 2 as an example, assuming that the user needs to measure the cross voltage of the load device DUT, the user can set the power supply 91 and the power supply 92 to operate in the measurement mode, and set the series switch group 10 and the parallel switch group 12 to OFF state. According to the above description, assuming that the switch unit 14 is set to ON state, Person having ordinary skilled in the art can understand that almost all the voltage across the load device DUT is applied to the high impedance element Z. At this time, the power supply 91 can measure the voltage between its positive terminal to the measurement terminal of the high impedance element Z, and the power supply 92 can measure the voltage between the measurement terminal of the high impedance element Z to its negative terminals. Subsequently, voltage values measured by the power supply 91 and the power supply 92 can be added together to obtain the cross voltage of the load device DUT.

In practice, suppose that the upper limit of the voltage that can be measured by the power supply 91 and the power supply 92 are both 600V. When the load device DUT is a large-capacity battery (for example, the cross voltage is 1000V), theoretically either power supply cannot measure the cross voltage of the load device DUT alone. However, because the voltage isolation circuit 1 of the present invention has the high impedance element Z, each of the power supply 91 and the power supply 92 can measure half the voltage across the load device DUT, that is 500V (less than the upper limit 600V). Finally, the voltage values (500V) measured by each of the power supply 91 and the power supply 92 are added together to obtain the cross voltage of the load device DUT. It can be seen that because the voltage isolation circuit 1 of this embodiment has the high impedance element Z, the measurement limit to the load device DUT can be increased.

It is worth mentioning that the load device DUT may already have a certain voltage while being tested. If the power supply 91, the power supply 92, and the load device DUT are directly conducted, sparks and surge current may be generated no matter whether the power supply 91 and the power supply 92 are connected in series or in parallel to the load device DUT. In order to deal with the above-mentioned problems, this embodiment proposes a mechanism for pre-charging the voltage isolation circuit 1 and then connecting the load device DUT. In an example, the voltage isolation circuit 1 can firstly measure the cross voltage (the external voltage value) of the load device DUT by using the aforementioned method. Next, if the power supply 91 and the power supply 92 are to be connected in series, the power supply 91 and the power supply 92 can be pre-charged, so that the total voltage value of the power supply 91 and the power supply 92 connected in series is the same as the external voltage value. When there is no voltage difference between the load device DUT and the power supplies 91-92, and then the series switch group 10 or the switch unit 14 can be conducted, sparks and surge current can be reduced effectively. Similarly, if the power supply 91 and the power supply 92 are to be connected in parallel, the power supply 91 and the power supply 92 can be pre-charged so that the individual voltage values (specific voltage values) of the power supply 91 and the power supply 92 are the same as the external voltage value. When there is no voltage difference between the load device DUT and the power supply 91, and no voltage difference between the load device DUT and the power supply 92, the parallel switch group 12 or the switch unit 14 can be conducted. And, sparks and surge current can also be effectively reduced.

Figure 3:
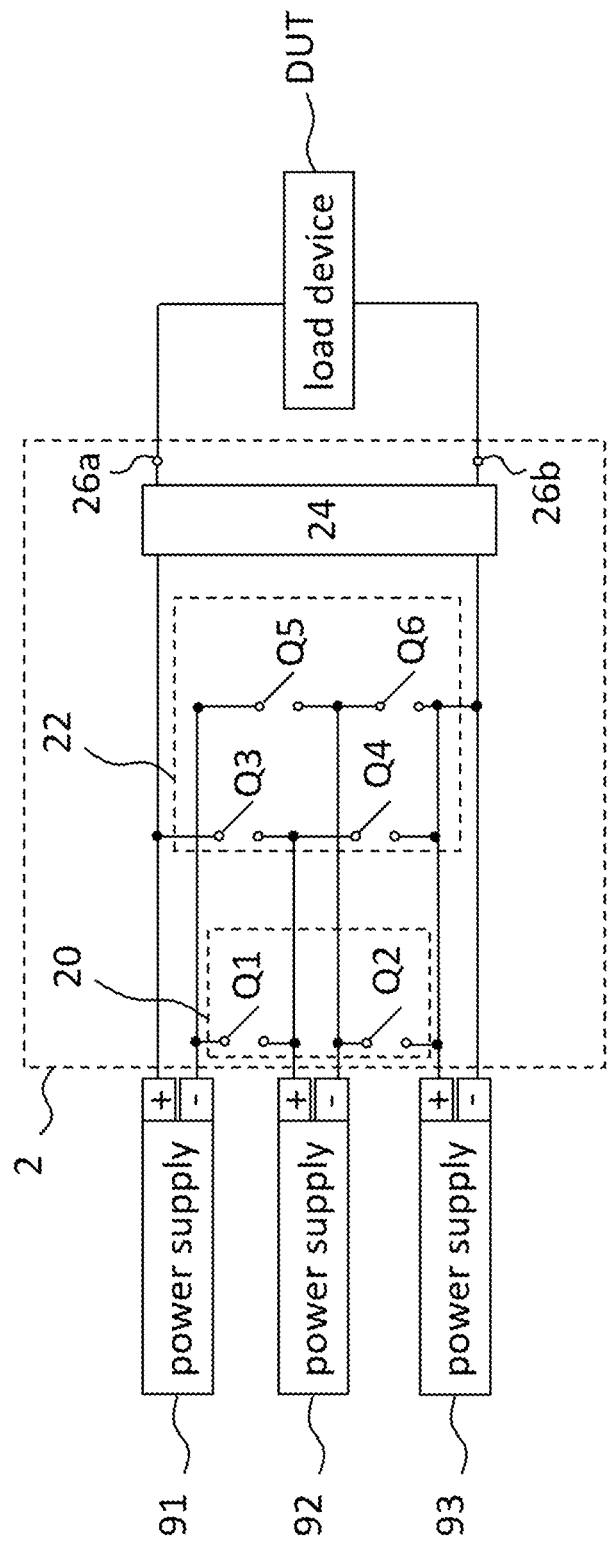
FIG. 3 is a schematic diagram of the voltage isolation circuit in accordance with another embodiment of the present invention.

In practice, the voltage isolation circuit 1 of the present invention is not limited to connecting two power supplies. For example, the following embodiment will demonstrate an example in which the voltage isolation circuit is connected to multiple power supplies. Please refer to FIG. 2 and FIG. 3 together, FIG. 3 is a schematic diagram of the voltage isolation circuit in accordance with another embodiment of the present invention. As shown in the figures, the voltage isolation circuit 2 can be connected between the power supply 91, the power supply 92, the power supply 93, and the load device DUT. The same as the embodiment in FIG. 2, the voltage isolation circuit 2 can also comprise a series switch group 20, a parallel switch group 22, and a switch unit 24. Besides, the first end 26a is connected to the positive terminal of the load device DUT, and the second end 26b is connected to the negative terminal of the load device DUT. However, the difference between the embodiment of FIG. 2 and FIG. 3 is that the number of transistors in the series switch group 20 and the parallel switch group 22 varies with the number of power supplies. In an example, the series switch group 20 may have a transistor Q1 and a transistor Q2, and the parallel switch group 22 may have a transistor Q3, a transistor Q4, a transistor Q5, and a transistor Q6. In addition, the number of high impedance elements Z is also different, each of the transistor Q1 and the transistor Q2 of this embodiment can connect one high impedance element Z in parallel.

In practice, assuming that the user needs to test the load device DUT with a large voltage, the user can set the power supply 91, the power supply 92, and the power supply 93 to operate in the power supply mode. As in the previous embodiment, the series switch group 20 is conducted, and the parallel switch group 22 is not conducted. At this time, the transistor Q1 and the transistor Q2 are conducted, so that the power supply 91, the power supply 92, and the power supply 93 can form a series current loop. On the other hand, if the user needs to test the load device DUT with a large current, the user can also set the power supply 91, the power supply 92, and the power supply 93 to operate in the power supply mode. In detail, the parallel switch group 22 is conducted, and the series switch group 20 is not conducted. At this time, the transistors Q3 to Q6 are conducted, so that the power supply 91, the power supply 92, and the power supply 93 can form a parallel current loop. Similarly, the voltage isolation circuit 2 of this embodiment demonstrates that multiple power supplies can switch between series and parallel connections at will. The voltage isolation circuit 2 does not need to reassemble the wire connecting multiple power supplies, and also can transmit a large output voltage or large current to test the load device DUT.

In addition, assuming that the user needs to measure the cross voltage of the load device DUT, the user can set the power supply 91, the power supply 92, and the power supply 93 to operate in the measurement mode, and set both of the series switch group 20 and the parallel switch group 22 to OFF state. Similar to the previous embodiment, the power supply 91 can measure the voltage between its positive terminal and the measurement terminal of the first high impedance element Z, and the power supply 92 can measure the voltage between the measurement terminal of the first high impedance element Z and the measurement terminal of the second high impedance element Z, and the power supply 93 can measure the voltage between the measurement terminal of the second high impedance element Z and its own negative terminal. This embodiment can also demonstrates the ability of increasing the upper limit for measuring the cross voltage of the load device DUT. Comparing with FIG. 1, because the cross voltage (for example, 1000V) of the load device DUT in FIG. 1 mainly carried by the switch unit 94, the switch unit 94 needs to withstand voltage to 1000V. Conversely, because the transistor Q1 is disposed between the power supply 91 and the power supply 92, and the transistor Q2 is disposed between the power supply 92 and the power supply 93, the transistor Q1 and the transistor Q2 only need to carry half of the cross voltage of the load device DUT, which may be, for example, 500V. Person having ordinary skilled in the art can understand that the withstand voltage required by the switch unit 94 is much higher than the withstand voltage required by the transistor Q1 or the transistor Q2 of this embodiment. It is obvious that the cost of the voltage isolation circuit 2 demonstrated in this embodiment can be lower.

Figure 4:
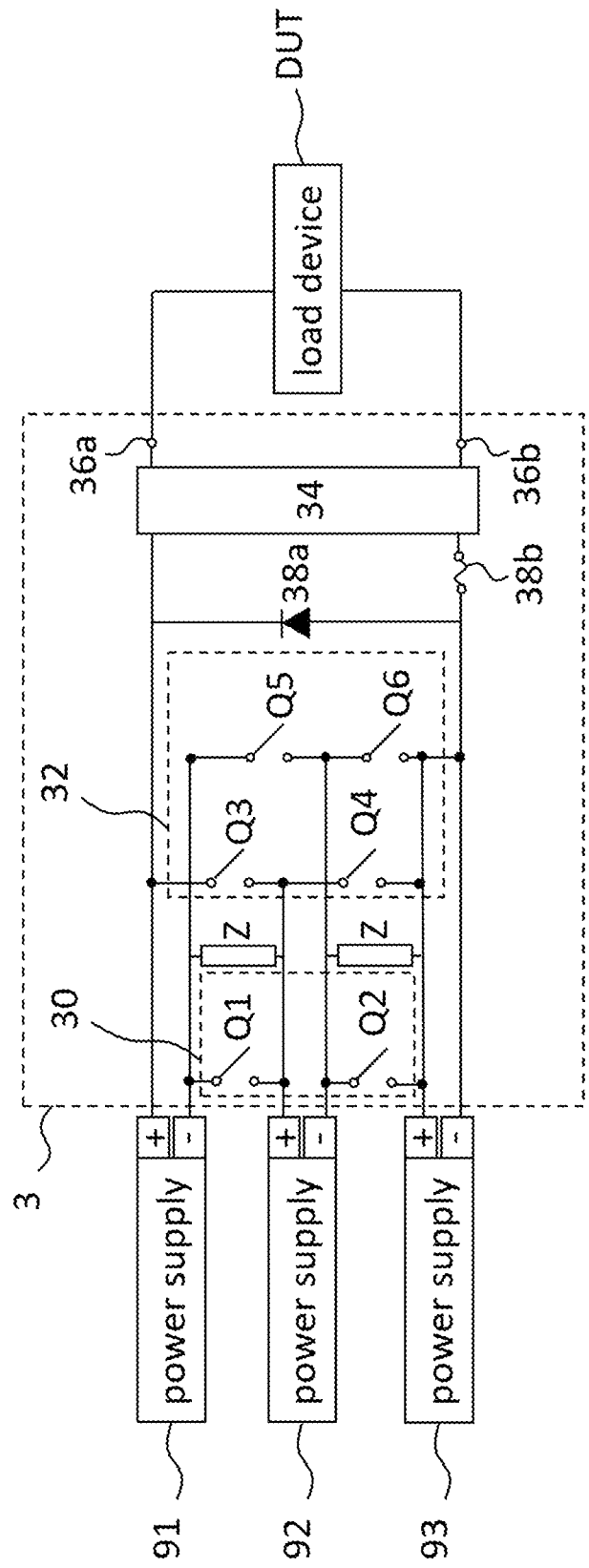
FIG. 4 is a schematic diagram of the voltage isolation circuit in accordance with another embodiment of the present invention.

When the user connects the load device DUT to the voltage isolation circuit, there may have misoperation by accident, and it may cause damages to the power supply. In order to avoid the above-mentioned problems, the voltage isolation circuit of the present invention may also have a reverse connection detection means and a short-circuit detection means. Please refer to FIGS. 3 and 4 together, FIG. 4 is a schematic diagram of the voltage isolation circuit in accordance with another embodiment of the present invention. The same as the voltage isolation circuit 2 of FIG. 3, the voltage isolation circuit 3 of FIG. 4 also comprises a series switch group 30, a parallel switch group 32, and a switch unit 34. The first end 36a is connected to the positive terminal of the load device DUT, and the second end 36b is connected to the negative terminal of the load device DUT. In addition, the series switch group 30 may also have a transistor Q1 and a transistor Q2, and the parallel switch group 32 may also have a transistor Q3, a transistor Q4, a transistor Q5, and a transistor Q6. Each of the transistor Q1 and the transistor Q2 of this embodiment can connect one high impedance element Z in parallel.

Different from the voltage isolation circuit 2 of FIG. 3, the voltage isolation circuit 3 further comprises a diode 38a and a protection element 38b. In an example, suppose that the user needs to measure the cross voltage of the load device DUT, and set the power supply 91, the power supply 92, and the power supply 93 to operate in the measurement mode. If the user mistakenly connects the positive terminal of the load device DUT to the second end 36b and connects the negative terminal of the load device DUT to the first end 36a, it can be a so-called reverse connection of the load device DUT. Since the cross voltage of the load device DUT is very large, it is very likely that a large current might rush into the power supply and the voltage isolation circuit from an incorrect end (such as the second end 36b) causing serious damage. In order to avoid the above-mentioned misoperation, the diode 38a of this embodiment provides a current path (a reverse connection detection loop) from bottom to top (the second end 36b to the first end 36a). When the load device DUT is reversely connected, the large current entering from the second end 36b can flow to the first end 36a through the diode 38a, and then return to the load device DUT to prevent the large current from damaging other circuit elements of the voltage isolation circuit 3 or power supplies.

The protection element 38b provided in this embodiment can be a fuse. When the current entering from the second end 36b is too large, the protection element 38b will automatically burn out to form an open circuit, which can protect other circuit elements of the voltage isolation circuit 3 or power supplies. In an example, the voltage isolation circuit 3 may have multi circuit boards. For example, there may be one mother board connected by more than one sub-boards. In practice, the protection element 38b can be located on the sub-board, and the other circuit elements of the voltage isolation circuit 3 can be located on the mother board. When the protection element 38b is burnt, since other circuit elements of the mother circuit board can still work normally, the voltage isolation circuit 3 of this embodiment does not need to be removed for maintenance or replacement, but only a new sub-board is needed (that is, replacing the protective element 38b).

It is worth mentioning that the protection element 38b is not an essential element. In this embodiment, the switch unit 34 can also be controlled to achieve a similar function. For example, the voltage isolation circuit 3 may also be provided with a current detecting element, such as a Hall sensor (not shown) in the reverse connection detection loop. When the current value detected by the Hall sensor exceeds a threshold value, it can be determined that the load device DUT is reversely connected. At this time, as long as the switch unit 34 is controlled to form an open circuit, that is, the first end 36a and the second end 36b are not connected to the multiple power supplies, other circuit elements of the voltage isolation circuit 3 can also be protected. In this way, the function of the protection element 38b may be replaced by the switch unit 34. In addition, when the current value detected by the Hall sensor exceeds the threshold value, the voltage isolation circuit 3 may also issue a warning to remind the user that the load device DUT is reversely connected.

Misoperation is not limited to occur at the time when measuring the cross voltage of the load device DUT, for example, it may also occur when a large current is fed into the load device DUT. In an example, when the power supply 91, the power supply 92, and the power supply 93 are set to operate in the power supply mode, if the first end 36a and the second end 36b are accidentally short-circuited together, or the load device DUT is short-circuited internally, sparks or surge currents may also be generated. For the above-mentioned short circuit situation of the load device DUT, this embodiment also has a corresponding control strategy. In an example, a current detection element may be provided at the first end 36a or the second end 36b, such as the aforementioned Hall sensor (not shown). At this time, if the load device DUT between the first end 36a and the second end 36b is shorted, it means that the current value measured by the Hall sensor will exceed the threshold value and can quickly determine that the load device DUT is short-circuited. Similar to the foregoing example of the reversely connected load device DUT, as long as the switch unit 34 is controlled to form an open circuit, that is, the first end 36a and the second end 36b are not connected to multiple power supplies, the other circuit elements of the voltage isolation circuit 3 can also be protected.

Following the above example, this embodiment also provides a means for re-connecting the voltage isolation circuit 3 to the load device DUT, especially for the case where the voltage isolation circuit 3 needs to reconnect to the load device DUT that has a short circuit. First, after the switch unit 34 is not conducted (OFF), the processing unit (such as a computer) will automatically turn off the power supply 91, the power supply 92, and the power supply 93, or automatically set the output voltages of the power supply 91, the power supply 92, and the power supply to zero. Then, after the output voltages of the power supply 91, the power supply 92, and the power supply 93 are zero, the processing unit will give a control signal to conduct the switch unit 34 again. Since the output voltages of the power supply 91, the power supply 92, and the power supply 93 at this time are zero, and there is almost no voltage difference with the short-circuited load device DUT, sparks can be avoided when the switch unit 34 is conducted again. In addition, when the load device DUT is not short-circuited anymore, the power supply 91, the power supply 92, and the power supply 93 can charge the load device DUT in a constant current mode to restore normal operation. It is worth mentioning that the switch unit 34 of this embodiment is also a non-essential element. As long as the series switch group 30 and the parallel switch group 32 are controlled, the same effect should be achieved.

For example, in the absence of the switch unit 34, if the load device DUT between the first end 36a and the second end 36b is short-circuited, the series switch group 30 and the parallel switch group 32 can be turned off immediately to protect multiple power supplies. After multiple power supplies disconnect the load device DUT, the processing unit (such as a computer) will automatically turn off the multiple power supplies or automatically set the output voltages of the multiple power supplies to zero. Then, the processing unit will give a control signal to turn on the series switch group 30 or the parallel switch group 32 again. Similarly, because there is almost no voltage difference between the multiple power supplies and the short-circuited load device DUT, it is possible to avoid sparks when the series switch group 30 or the parallel switch group 32 is conducted again. Finally, when the load device DUT is not short-circuited anymore, the power supply 91, the power supply 92, and the power supply 93 can charge the load device DUT in a constant current mode to restore normal operation.

In summary, the voltage isolation circuit provided by the present invention can provide high voltage and high current selectively while providing power to the load device. And, the cross voltage of the load device can be read by the power supplies correctly when the load device is to be measured. In addition, the voltage isolation circuit provided by the present invention can also detect the voltage difference between the power supply and the load device, so as to prevent the power supply and the load device from being conducted when the voltage difference is too large, and reduce the possibility of danger.

What is claimed is:

1. A voltage isolation circuit, electrically connected between a first power supply and a second power supply, comprising:
   a first transistor electrically connected to a negative terminal of the first power supply and a positive terminal of the second power supply;
   a second transistor electrically connected to a positive terminal of the first power supply and a positive terminal of the second power supply;
   a third transistor electrically connected to the negative terminal of the first power supply and the negative terminal of the second power supply;
   a first high impedance element, electrically connected to the first transistor in parallel, having a measurement terminal;
   a first end, connected to the positive terminal of the first power supply;
   a second end, connected to the negative terminal of the second power supply, wherein the first end and the second end are electrically connected to a load device;
   a switch unit, selectively conducted the first end and the second end to first power supply and the second power supply; and
   a reverse connection detection loop, wherein when the first power supply and the second power supply are operated in a measurement mode, the reverse connection detection loop is used to determine whether the load device is reversely connected, and when the load device is reversely connected, the switch unit does not conduct the first end and the second end to the first power supply and the second power supply;
   wherein impedance values measured from the negative terminal of the first power supply to the measurement terminal and measured from the measurement terminal to the positive terminal of the second power supply are the same;
   wherein the first transistor is controlled by a first control signal, when the first transistor is conducted, the first power supply and the second power supply are electrically connected in series in a first current loop;
   wherein the second transistor and the third transistor are controlled by a second control signal, when the second transistor and the third transistor are conducted, the first power supply and the second power supply are electrically connected in parallel in a second current loop.

2. A voltage isolation circuit, electrically connected between a first power supply and a second power supply, comprising:
   a first transistor electrically connected to a negative terminal of the first power supply and a positive terminal of the second power supply;
   a second transistor electrically connected to a positive terminal of the first power supply and a positive terminal of the second power supply;
   a third transistor electrically connected to the negative terminal of the first power supply and the negative terminal of the second power supply; and
   a first high impedance element, electrically connected to the first transistor in parallel, having a measurement terminal;
   a first end, connected to the positive terminal of the first power supply;
   a second end, connected to the negative terminal of the second power supply, wherein the first end and the second end are electrically connected to a load device;
   a switch unit, selectively conducted the first end and the second end to first power supply and the second power supply; and
   a short-circuit detection loop, wherein when the first power supply and the second power supply are operated in a power supply mode, the short-circuit detection loop is used to determine whether the first end and the second end are shorted, and when the first end and the second end are shorted, the switch unit does not conduct the first end and the second end to the first power supply and the second power supply;
   wherein impedance values measured from the negative terminal of the first power supply to the measurement terminal and measured from the measurement terminal to the positive terminal of the second power supply are the same;
   wherein the first transistor is controlled by a first control signal, when the first transistor is conducted, the first power supply and the second power supply are electrically connected in series in a first current loop;
   wherein the second transistor and the third transistor are controlled by a second control signal, when the second transistor and the third transistor are conducted, the first power supply and the second power supply are electrically connected in parallel in a second current loop.

3. The voltage isolation circuit according to claim 2, wherein the first power supply and the second power supply stop supplying power after the switch unit does not conduct the first end and the second end to the first power supply and the second power supply, and the first power supply and the second power supply provide power in a constant current mode after output voltages of the first power supply and the second power supply are zero respectively.

4. A voltage isolation circuit, electrically connected to a plurality of power supplies, comprising:
   a series switch group, controlled by a first control signal, comprising a transistor, arranged in a first current loop, having two channels, connected to one of the plurality of power supplies respectively;

a parallel switch group controlled by a second control signal;

a first high impedance element, electrically connected with the transistor in parallel, having a measurement terminal and two ends, connected to one of the plurality of power supplies respectively;

a first end, connected to one of the plurality of power supplies; and a second end, connected to another one of the plurality of power supplies;

wherein the first and second ends are electrically connected to a load device to obtain an external voltage value of the load device;

wherein when the series switch group is conducted, the plurality of power supplies are electrically connected in series in the first current loop;

wherein when the parallel switch group is conducted, the plurality of power supplies are electrically connected in parallel in a second current loop;

wherein impedance values measured from the measurement terminal to each ends of the first high impedance element are the same;

wherein when a total voltage value, provided by the plurality of power supplies, is the same as the external voltage value, a processing unit provides the first control signal so that the plurality of power supplies are electrically connected in series in the first current loop.

5. A voltage isolation circuit, electrically connected to a plurality of power supplies, comprising:

a series switch group, controlled by a first control signal, comprising a transistor, arranged in a first current loop, having two channels, connected to one of the plurality of power supplies respectively;

a parallel switch group controlled by a second control signal;

a first high impedance element, electrically connected with the transistor in parallel, having a measurement terminal and two ends, connected to one of the plurality of power supplies respectively;

a first end, connected to one of the plurality of power supplies; and a second end, connected to another one of the plurality of power supplies;

wherein the first and second ends are electrically connected to a load device to obtain an external voltage value of the load device;

wherein when the series switch group is conducted, the plurality of power supplies are electrically connected in series in the first current loop;

wherein when the parallel switch group is conducted, the plurality of power supplies are electrically connected in parallel in a second current loop;

wherein impedance values measured from the measurement terminal to each ends of the first high impedance element are the same;

wherein when a specific voltage value, provided by each of the plurality of power supplies, is the same as the external voltage value, a processing unit provides the second control signal so that the plurality of power supplies are electrically connected in parallel in the second current loop.

* * * * *